(12) United States Patent
Huo

(10) Patent No.: US 10,950,632 B2
(45) Date of Patent: Mar. 16, 2021

(54) ARRAY SUBSTRATE, METHOD FOR FABRICATING THE SAME AND DISPLAY PANEL

(71) Applicant: WUHAN TIANMA MICRO-ELECTRONICS CO., LTD., Wuhan (CN)

(72) Inventor: Sitao Huo, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 35 days.

(21) Appl. No.: 16/388,736

(22) Filed: Apr. 18, 2019

(65) Prior Publication Data

US 2020/0203384 A1 Jun. 25, 2020

(30) Foreign Application Priority Data

Dec. 25, 2018 (CN) .......................... 201811592075.8

(51) Int. Cl.
*H01L 27/12* (2006.01)
(52) U.S. Cl.
CPC ...... *H01L 27/1218* (2013.01); *H01L 27/1262* (2013.01); *H01L 27/1288* (2013.01)
(58) Field of Classification Search
CPC ............ H01L 27/1218; H01L 27/1262; H01L 27/1288
See application file for complete search history.

(56) References Cited

U.S. PATENT DOCUMENTS

| 9,287,332 B2* | 3/2016 | Hatano | H01L 51/5265 |
| 9,741,967 B2* | 8/2017 | Ohsawa | H01L 51/5265 |
| 2005/0040756 A1* | 2/2005 | Winters | H01L 51/5265 |
| | | | 313/504 |
| 2014/0231760 A1* | 8/2014 | Ye | H01L 27/3211 |
| | | | 257/40 |
| 2017/0110519 A1* | 4/2017 | Hsu | H01L 27/326 |
| 2019/0385518 A1* | 12/2019 | Hwang | G09G 3/3233 |

FOREIGN PATENT DOCUMENTS

| CN | 104900684 A | 9/2015 |
| CN | 107146804 A | 9/2017 |
| CN | 107507573 A | 12/2017 |
| KR | 20100058225 A | 6/2010 |

\* cited by examiner

*Primary Examiner* — Mark W Tornow
(74) *Attorney, Agent, or Firm* — Alston & Bird LLP

(57) ABSTRACT

An array substrate, a method for fabricating the array substrate and a display panel. The array substrate is provided with at least one isolation mesa in each of multiple pixel grooves in a pixel-defining layer, so that a light-emitting layer of a second sub-pixel located on the isolation mesa and a light-emitting layer of a first sub-pixel located on an exposed portion of a bottom surface of the pixel groove are on different planes and thereby isolated. It is prevented that an adjacent sub-pixel is influenced via the light-emitting layer, in a case that the anode of the second sub-pixel and the anode of the first sub-pixel receive different voltages. The isolation mesa does not form a non-emitting region in the pixel groove. An aperture ratio of the array substrate is not reduced. High PPI of the array substrate is ensured.

10 Claims, 14 Drawing Sheets

ARRAY SUBSTRATE, METHOD FOR FABRICATING THE SAME AND DISPLAY PANEL

The present application claims the priority to Chinese patent application No. 2018/11592075.8 titled "ARRAY SUBSTRATE, METHOD FOR FABRICATING THE SAME AND DISPLAY PANEL", filed with the China National Intellectual Property Administration (CNIPA) on Dec. 25, 2018, which is incorporated herein by reference in its entirety.

FIELD

The present disclosure relates to the technical field of displays, and in particular, to an array substrate, a method for fabricating the array substrate, and a display panel.

BACKGROUND

With continuous development of display technology, the application of display panels becomes increasingly wide. A self-emitting display panel refers to those where display pixels on the array substrates are formed by active light-emitting units. The active light-emitting units can emit light without being excited by a backlight, so as to display an image. Thereby, a backlight module of a display apparatus is no longer necessary, which facilitates reducing an overall thickness of the display apparatus.

An organic light-emitting diode (OLED) display panel is a type of the self-emitting display panel. The OLED display panel has the advantages of fast response, gorgeous color, light weight, and convenience. PPI (pixel per inch) of the OLED display panel is supposed to be increased also for improved resolution. The conventional technologies may configure one display pixel into multiple sub-pixels that emit light of the same color, so as to achieve the objective of increasing the PPI of the display panel.

When the multiple sub-pixels in a same display pixel receive different voltages, a sub-pixel may be affected by the voltage of an adjacent sub-pixel, resulting in a deteriorated display effect of the affected sub-pixels. Thereby, the display effect of the display panel can have poorer resolution, producing a negative impact on the user's visual experience.

SUMMARY

To address the above technical issue, an array substrate, a method for fabricating the array substrate and a display panel are provided according to the present disclosure, so as to achieve an objective of preventing voltages received by sub-pixels of a same display pixel in the array substrate from affecting each other.

To achieve the above technical objective, following technology solutions are provided according to embodiments of the present disclosure.

An array substrate includes a first substrate, a pixel-defining layer located on the first substrate, where the pixel-defining layer includes multiple pixel grooves arranged in an array; at least one isolation mesa, located in each of the multiple pixel grooves, where a bottom surface of each of the multiple pixel grooves is partially covered by the at least one isolation mesa; a first sub-pixel, located on an uncovered portion of the bottom surface of each of the multiple pixel grooves; and a second sub-pixel, located at a side of the at least one isolation mesa facing away from the first substrate; where the first sub-pixel includes a first anode, the second sub-pixel includes a second anode, a light-emitting layer is located on the first anode and the second anode, and a cathode located at a side of the light-emitting layer facing away from the first substrate.

A method for fabricating an array substrate is also disclosed which includes: providing a first substrate; forming a pixel-defining layer on a first substrate, where the pixel-defining layer includes multiple pixel grooves arranged in an array; forming, by using a first mask, an first anode of a first sub-pixel in each of the multiple pixel grooves, where a bottom surface of each of the multiple pixel grooves is partially covered by the first anode of the first sub-pixel; forming, by using a second mask, an isolation mesa in each of the multiple pixel grooves, where the isolation mesa is disposed on the uncovered portion of the bottom surface of each of the multiple grooves is covered by the isolation mesa; forming, by using the second mask, a second anode of a second sub-pixel on a side of the isolation mesa facing away from the first substrate; providing a third mask on the pixel-defining layer, where the first anode of the first sub-pixel and the second anode of the second sub-pixel are exposed by the third mask; forming, by using the third mask, a light-emitting layer on a side of the first anode of the first sub-pixel and the second anode of the second sub-pixel facing away from the first substrate; and forming a cathode on a side of the light-emitting layer facing away from the first substrate, to form the first sub-pixel and the second sub-pixel that is located on a surface of the isolation mesa, where a quantity of the first sub-pixel and a quantity of the second sub-pixel are both more than one.

According to another embodiment, a display panel includes an array substrate disclosed as above.

Preferably, the array substrate is provided with at least one isolation mesa in each of the multiple pixel grooves in the pixel-defining layer, so that the light-emitting layer of the second sub-pixel located on the isolation mesa and the light-emitting layer of the first sub-pixel located on the exposed portion of the bottom surface of the pixel groove are on different planes. Thereby, the objective of isolating the light-emitting layer of the second sub-pixel and the light-emitting layer of the first sub-pixel is achieved. It is prevented that an adjacent sub-pixel is influenced via the light-emitting layer, in a case that the anode of the second sub-pixel and the anode of the first sub-pixel receive different voltages. A display effect of the sub-pixels is improved.

Additionally, the isolation mesa arranged in the pixel groove is covered by the light-emitting layer of the second sub-pixel, and the isolation mesa does not form a non-emitting region in the pixel groove. Therefore the aperture ratio of the array substrate is not reduced. High PPI of the array substrate is ensured on the basis of avoiding an influence of crosstalk between the adjacent sub-pixels.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION

Figure 1:
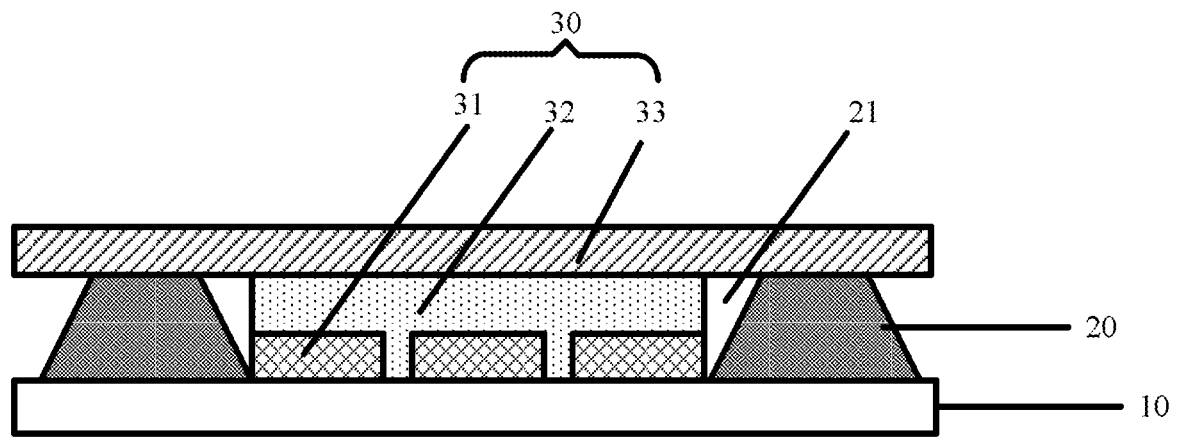
FIG. 1 is a cross-sectional view of a conventional array substrate structure.

Referred to FIG. 1, is a schematic diagram of a schematic cross-sectional view of an array substrate structure in conventional technology, where one display pixel is configured as multiple sub-pixels that emit light with a same color. A substrate 10 and a pixel-defining layer 20 located on the substrate are indicated in the array substrate as shown in FIG. 1. The pixel-defining layer is provided with multiple pixel grooves 21 arranged in an array. Multiple anodes 31, a light-emitting layer 32 covering the multiple anodes 31, and an entire cathode 33 covering the light-emitting layer 32 are provided in each of the multiple pixel grooves 21. The multiple anodes 31 share the same light-emitting layer 32 and the same cathode 33, so as to form multiple sub-pixels 30. The light-emitting layer 32 is a conductive structure. For a same pixel groove 21, in a case that the anode 31 of one sub-pixel receives a voltage, an adjacent sub-pixel is affected via the common light-emitting layer 32. Thus, it is difficult for the sub-pixels to achieve accurate emission and display under control of different voltages.

Figure 2:
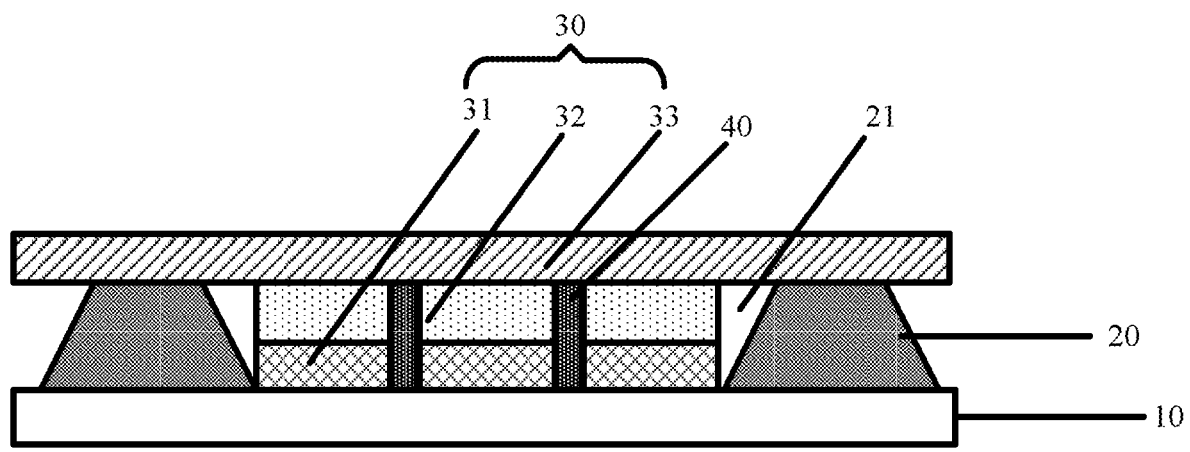
FIG. 2 is a cross-sectional view of another conventional array substrate structure.
Figure 3:
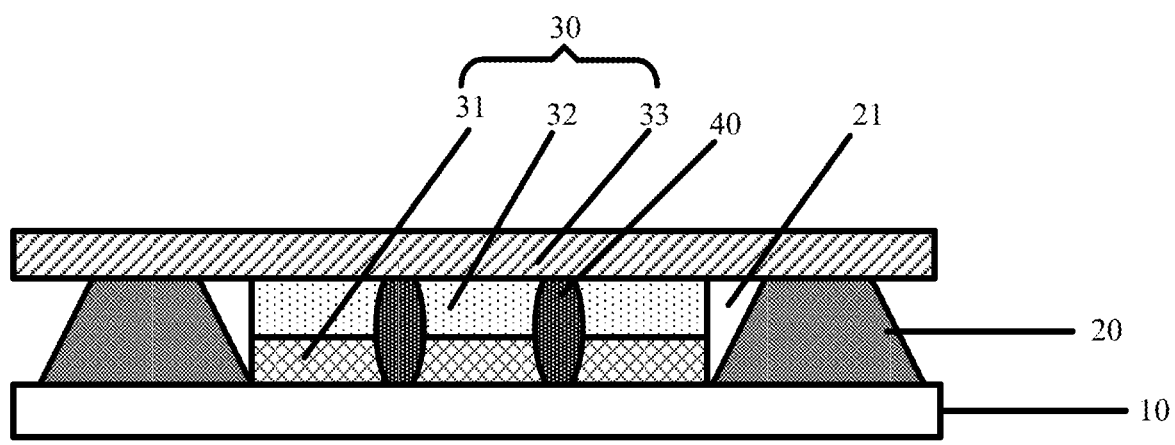
FIG. 3 is a cross-sectional view of yet another conventional array substrate structure.

References are made to FIGS. 2 and 3, which are schematic cross-sectional views of an array substrate structure in which multiple sub-pixels form one display pixel. Isolation structures 40 located between the anodes are indicated besides the substrate 10, the pixel-defining layer 20, the groove 21, the anode 31, the light-emitting layer 32 and the cathode 33, in the array substrates shown in FIGS. 2 and 3. The isolation structures 40 are configured to isolate the light-emitting layers 32 of the adjacent sub-pixels, thereby preventing the voltage received by the anode 31 of a certain sub-pixel from affecting the adjacent sub-pixel via the light-emitting layer 32 connected to the adjacent sub-pixel. By adding the isolation structure 40 that is not used for display, an aperture ratio of the array substrate is inevitably reduced for the array substrates in FIGS. 2 and 3. Thereby, PPI of the array substrate and the display panel is reduced, which is contrary to the original motivation of configuring the multiple sub-pixels 30 in the same groove 21.

In view of the above, an array substrate is provided according to the present disclosure, including a first substrate, a pixel-defining layer, at least one isolation mesa, a first sub-pixel, and a second sub-pixel.

The pixel-defining layer is located on the first substrate, and includes multiple pixel grooves arranged in an array.

The at least one isolation mesa is located in each of the multiple pixel grooves, and a portion of a bottom surface of each of the multiple pixel grooves is covered by the at least one isolation mesa.

The first sub-pixel is located on an exposed portion of the bottom surface of each of the multiple pixel grooves, and the second sub-pixel is located at a side of the at least one isolation mesa facing away from the first substrate.

The sub-pixel includes an anode, a light-emitting layer located at a side of the anode facing away from the substrate, and a cathode located at a side of the light-emitting layer facing away from the substrate.

The array substrate is provided with the at least one isolation mesa in each of the multiple pixel grooves in the pixel-defining layer, so that the light-emitting layer of the second sub-pixel located on the isolation mesa and the light-emitting layer of the first sub-pixel located on the exposed portion of the bottom surface of the pixel groove are in different planes. Thereby, the objective of isolating the light-emitting layer of the second sub-pixel and the light-emitting layer of the first sub-pixel is achieved. It is prevented that the adjacent sub-pixel is influenced via the light-emitting layer in a case that the anode of the second sub-pixel and the anode of the first sub-pixel receive different voltages. A display effect of the sub-pixels is improved.

Additionally, the isolation mesa arranged in the pixel groove is covered by the light-emitting layer of the second sub-pixel, and does not form a non-emitting region in the pixel groove. An aperture ratio of the array substrate is not reduced. High PPI of the array substrate is ensured on the basis of avoiding an influence of crosstalk between the adjacent sub-pixels.

The technical solution according to the embodiments of the present disclosure will be described clearly and completely as follows in conjunction with the drawings. It is apparent that the described embodiments are only a part rather than all of the embodiments according to the present disclosure. Any other embodiments obtained by those skilled in the art based on the embodiments in the present disclosure without any creative work fall in the scope of the present disclosure.

An array panel is provided according to an embodiment of the present disclosure, including a first substrate 100, a pixel-defining layer 200, at least one isolation mesa 330, a first sub-pixel 310, and a second sub-pixel 320.

The pixel-defining layer 200 is located on the first substrate 100, and includes multiple pixel grooves arranged in an array.

The at least one isolation mesa 330 is located in each of the multiple pixel grooves, and a portion of a bottom surface of each of the multiple pixel grooves is covered by the at least one isolation mesa 330.

The first sub-pixel 310 is located on an exposed portion of the bottom surface of each of the multiple pixel grooves and the second sub-pixel 320 is located at a side of the at least one isolation mesa 330 facing away from the first substrate.

The sub-pixel includes an anode 301, a light-emitting layer 302 located at a side of the anode 301 facing away from the substrate, and a cathode 303 located at a side of the light-emitting layer facing away from the substrate.

Figure 4:
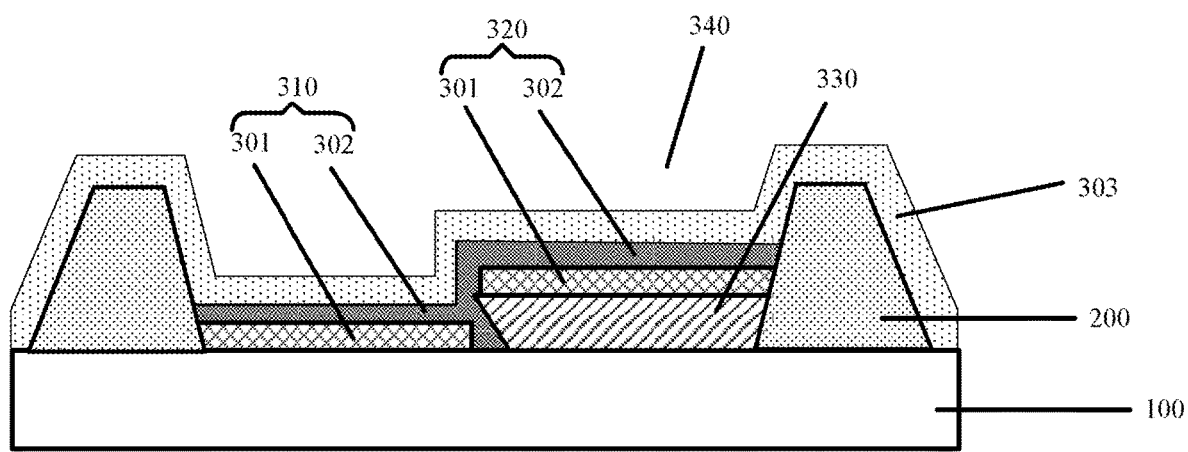
FIG. 4 is a schematic cross-sectional view of an array substrate structure according to an embodiment of the present disclosure.

For clear illustration, one pixel groove 340 is schematically illustrated in FIG. 4 and subsequent figures. In an actual array substrate, there are multiple pixel grooves in the pixel-defining layer 200. Reference is made to FIG. 4, where a pixel groove 340 is surrounded by pixel-defining layer 200.

In the embodiment, the anode 301 of the first sub-pixel 310 and the anode 301 of the second sub-pixel 320 are not in a same plane due to the existence of the isolation mesa 330, and are separated from each other. The anode 301 of the first sub-pixel 310 and the anode 301 of the second sub-pixel 320 are electrically insulated from each other. Thereby, the objective of isolating the anode 301 of the second sub-pixel 320 and the anode 301 of the first sub-pixel 310 is achieved. The light-emitting layer 302 of the first sub-pixel 310 and the light-emitting layer 302 of the second sub-pixel 320 are not in a same plane due to existence of the isolation mesa 330. The light-emitting layer 302 of the first sub-pixel 310 and the light emitting layer 302 of the second sub-pixel 320 are continuously filled in the gap between the anode 301 of the first sub-pixel 310 and the anode 301 of the second sub-pixel 320. It is prevented that an adjacent sub-pixel is influenced via the light-emitting layer 302 in a case that the anode 301 of the second sub-pixel 320 and the anode 301 of the first sub-pixel 310 receive different voltages. The display effect of the sub-pixels is improved. The cathode is continuously arranged on the light-emitting layer 302 and the isolation mesa 330.

Additionally, the isolation mesa 330 arranged in the pixel groove 340 is covered by the light-emitting layer 302 of the second sub-pixel 320, and does not form a non-emitting region in the pixel groove 340. An aperture ratio of the array substrate is not reduced. High PPI of the array substrate is ensured on the basis of avoiding an influence of crosstalk between the adjacent sub-pixels.

It should be noted that an orthographic projection of the anode 301 located on the isolation mesa 330 (that is, the anode 301 of the second sub-pixel 320) on the first substrate 100 and an orthographic projection of the anode 301 located on the surface of the pixel groove (that is, the anode 301 of the first sub-pixel 310) on the first substrate 100 does not overlap. Thereby, it is avoided that a large coupling capacitance is formed between the anodes of the two sub-pixels, and it is also avoided that light emitted from the light-emitting layer 302 of the first sub-pixel 310 is blocked by the anode 301 located on the isolation mesa 330.

In order to maximize the aperture ratio of the array substrate, the orthographic projection of the anode 301 of the second sub-pixel 320 on the first substrate 100 may abut against the orthographic projection of the anode 301 of the first sub-pixel 310 on the first substrate 100, to avoid a non-emitting region inside the pixel groove. It is understood that the orthographic projection of the anode 301 of the second sub-pixel 320 on the first substrate 100 and the orthographic projection of the anode 301 of the first sub-pixel 310 on the first substrate 100 may be separated by a certain distance, thereby a requirement on fabrication precision is lowered for forming the anode 301 of the second sub-pixel 320 and the anode 301 of the first sub-pixel 310.

Figure 5:
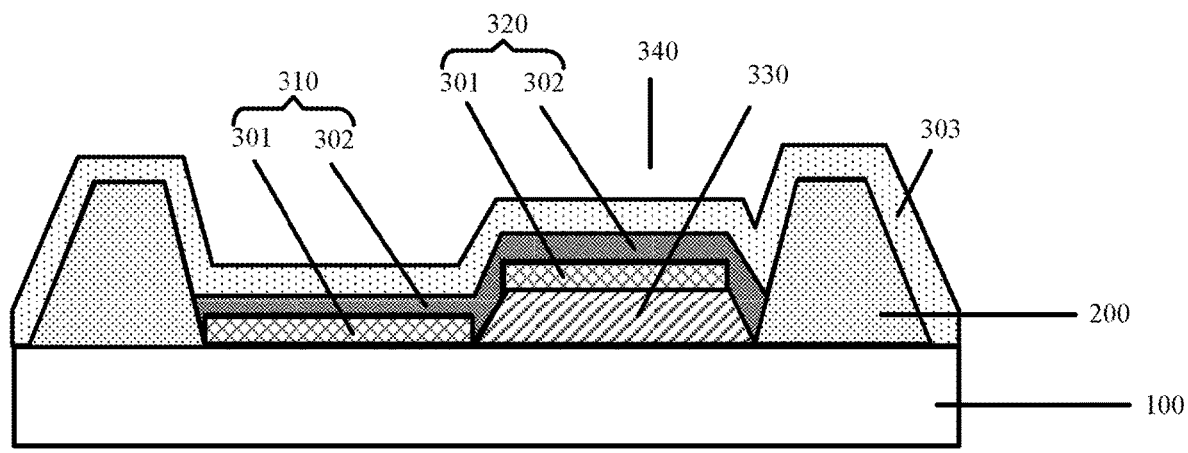
FIG. 5 is a schematic cross-sectional view of an array substrate according to another embodiment of the present disclosure.
Figure 6:
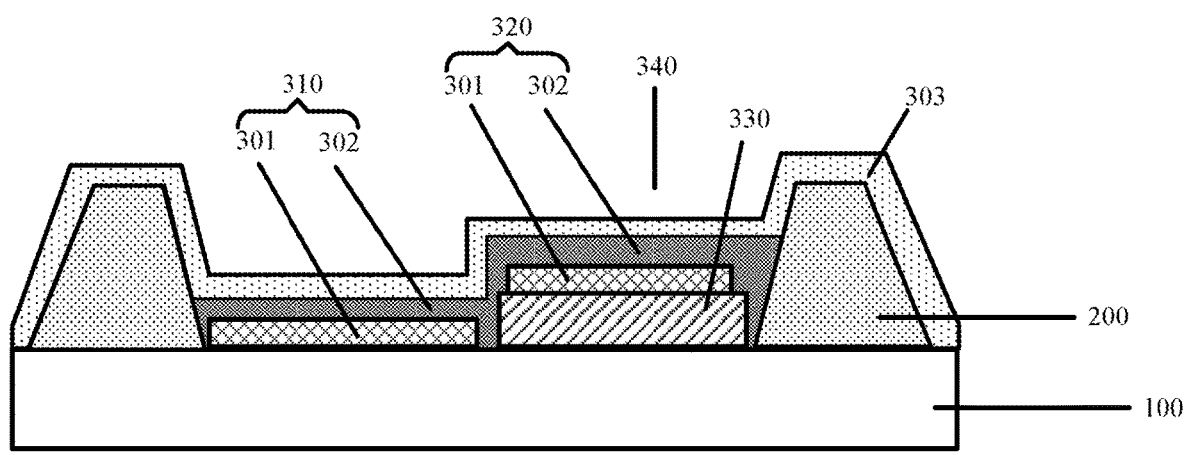
FIG. 6 is a schematic cross-sectional view of an array substrate structure according to yet another embodiment of the present disclosure.

A specific shape of the isolation mesa 330 is hereinafter described. References are made to FIGS. 4 to 6. FIGS. 5 and 6 are schematic cross-sectional views of an array substrate structure. In the structures shown in FIGS. 4 to 6, the isolation mesa 330 includes a first surface facing the substrate and a second surface facing away from the substrate.

In the structure shown in FIG. 5, an orthographic projection of the second surface on the substrate is located within an orthographic projection of the first surface on the substrate, and an area of the first surface is greater than an area of the second surface. Namely, referring to FIG. 5, a shape of a cross section of the isolation mesa 330 is a trapezoid.

In the structures shown in FIGS. 6 and 4, the orthographic projection of the second surface on the substrate is covered by the orthographic projection of the first surface on the first substrate. In FIG. 6, the orthographic projection of the first surface on the substrate is same as the orthographic projection of the second surface on the substrate. Namely, referring to FIG. 6, a shape of the cross section of the isolation mesa 330 is a rectangle.

In the structure shown in FIG. 4, the orthographic projection of the second surface on the substrate covers the orthographic projection of the first surface on the substrate, and the surface area of the first surface is smaller than the surface area of the second surface. Namely, referring to FIG. 4, a shape of the cross section of the isolation mesa 330 is an inverted trapezoid. Namely, the trapezoid includes a first side and a second side that are parallel, the second side is located at a side of the first side away from the substrate, and a length of the second side is greater than a length of the first side.

In the case that the isolation mesa 330 has a structure as shown in FIG. 4, the anode 301 of the first sub-pixel 310 and the anode 301 of the second sub-pixel 320 may be simultaneously formed by evaporating once in fabrication without arranging a mask. The reason is that the length of the second side of the inverted trapezoid is longer, and an evaporated material cannot extend from the bottom surface of the pixel groove, along a sidewall of the inverted trapezoid, to the surface of the pixel groove. Thereby, the isolation mesa 330 of the inverted trapezoidal structure is naturally capable to isolate the anode 301 formed by evaporation.

Optionally, the isolation mesa 330 is a mesa made of an organic insulating material or an inorganic insulating material. In a case that the isolation mesa 330 is the mesa made of the organic insulating material, a negative photoresist organic material may be used for fabrication. Thereby, the inverted trapezoidal isolation mesa 330 may be directly formed when the negative photoresist organic material layer is etched to form the isolation mesa 330. In a case that the isolation mesa 330 is the mesa made of the inorganic insulating material, the inverted trapezoidal isolation mesa 330 may be formed by controlling a parameter of an etching process when the inorganic material layer is etched to form the isolation mesa 330.

Figure 7:
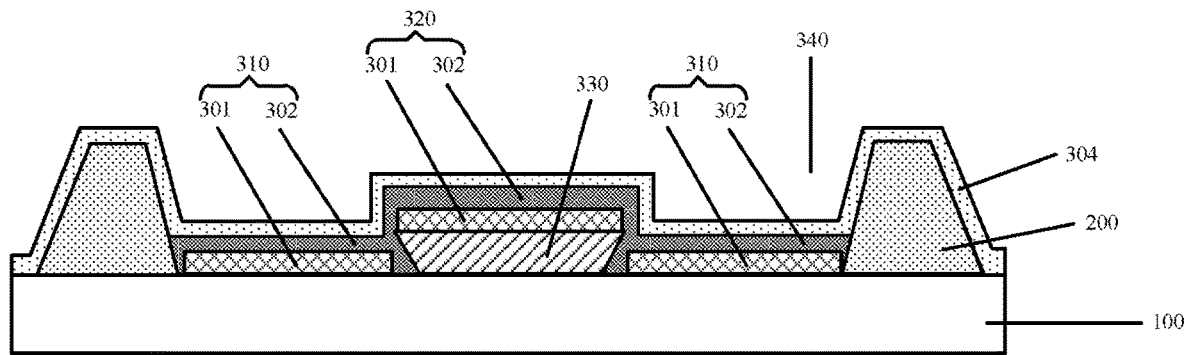
FIG. 7 is a schematic cross-sectional view of an array substrate structure according to yet another embodiment of the present disclosure.

According to another embodiment of the present disclosure based on the above embodiments, each of the multiple isolation grooves is provided with three sub-pixels. Reference is made to FIG. 7, which is a schematic cross-sectional view of an array substrate structure. Each of the multiple pixel grooves is provided with one isolation mesa 330.

Each of the multiple pixel grooves is provided with one second sub-pixel 320, and two first sub-pixels 310 that are respectively located at two sides of the isolation mesa 330.

In the structure shown in FIG. 7, the isolation mesa 330 in the pixel grooves is located at the center of the pixel groove, so as to achieve the effect of isolating the anodes 301 of the three sub-pixels.

In general, the light-emitting layers 302 of the sub-pixels located in the same pixel groove are of a same type. Namely, the sub-pixels in the same pixel groove are configured to emit reference lights of a same color (for example, one of red light, green light, or blue light). Thus, the light-emitting layers 302 of the sub-pixels in the same pixel groove can be acquired through one evaporation process in fabrication.

Figure 8:
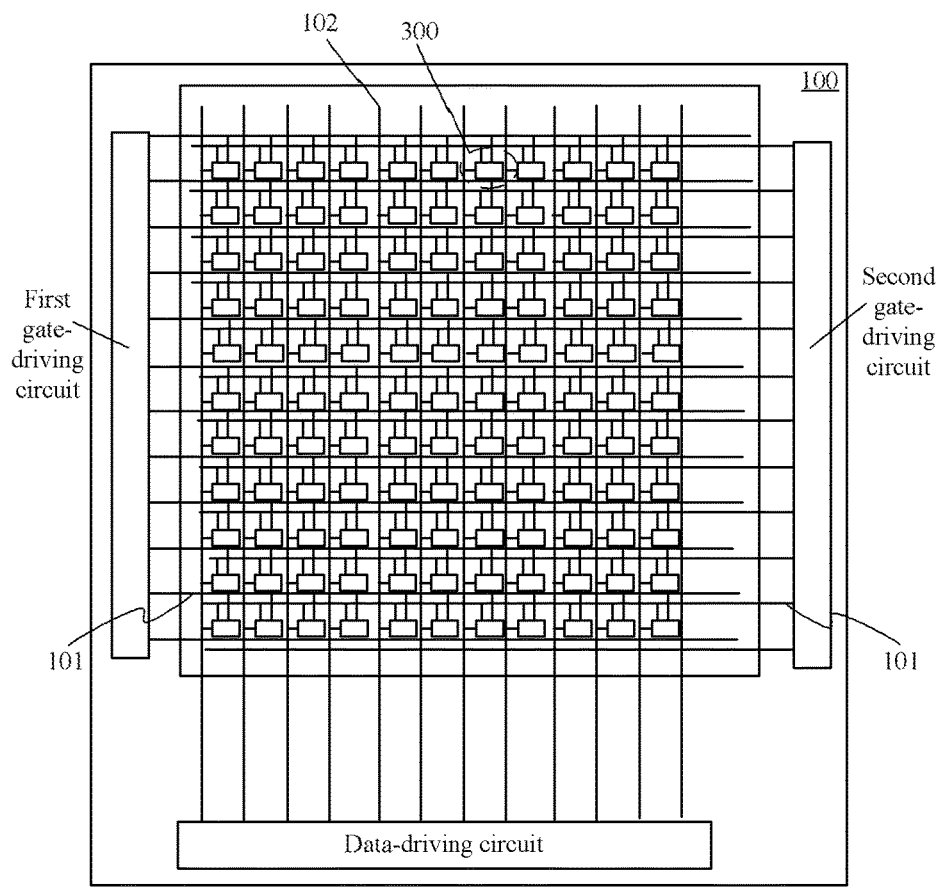
FIG. 8 is a schematic top view of an array substrate according to an embodiment of the present disclosure.
Figure 9:
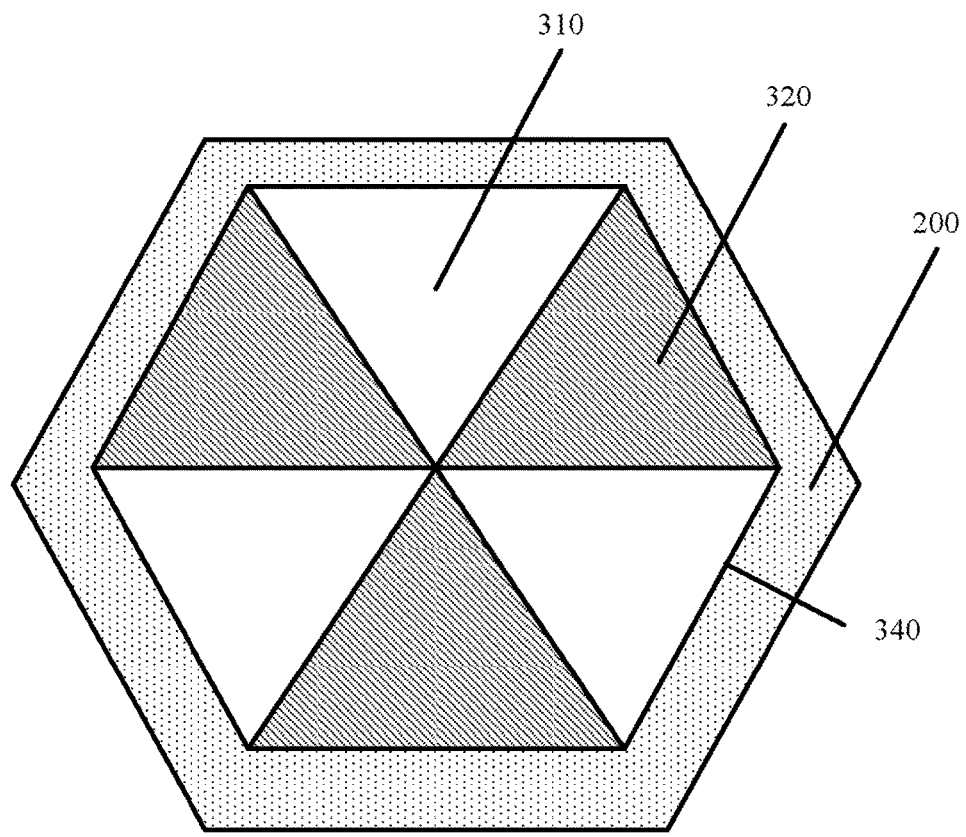
FIG. 9 is the enlarged top view of the dashed-line circle 300 in FIG. 8.

In another embodiment of the present disclosure based on the above embodiment, each of the multiple isolation grooves is provided with six sub-pixels. Reference is made to FIGS. 8 and 9. FIG. 8 is a schematic structural diagram of a top view of an array substrate, and FIG. 9 is a schematic structural diagram of an enlarged display pixel 300 in FIG. 8. In FIG. 8, gate lines 101 and data lines 102 that are located on the first substrate 100 and intersect, and display pixels 300 that are located in regions defined by the gate lines 101 and data lines 102, are illustrated. Each of the display pixels 300 is located in one of the multiple pixel grooves, and includes multiple sub-pixels. In addition, FIG. 8 also shows a first gate-driving circuit, a second gate-driving circuit, and a data-driving circuit. A gate-driving mode in FIG. 8 is cross-driving. In other embodiments of the present disclosure, the gate-driving mode of the array substrate may be a unilateral driving or a bilateral driving.

In the structure shown in FIG. 9, each of the multiple pixel grooves 340 are provided with three isolation mesas 330.

Each of the multiple pixel grooves is provided with three second sub-pixels 320 and three first sub-pixels 310.

The three isolation mesas 330 are configured to isolate the anodes 301 of the six sub-pixels. Specifically, reference is further made to FIG. 9, where a shape of a surface of the pixel groove is a regular hexagon.

A shape of a surface of the isolation mesa 330 is an equilateral triangle.

The three isolation mesas 330 in a same pixel groove have a common vertex. The adjacent isolation mesas 330 are separated by an angle of 60°.

PPI of the array substrate is greatly increased by providing each of the isolation grooves with six sub-pixels, which facilitates high resolution.

Figure 10:
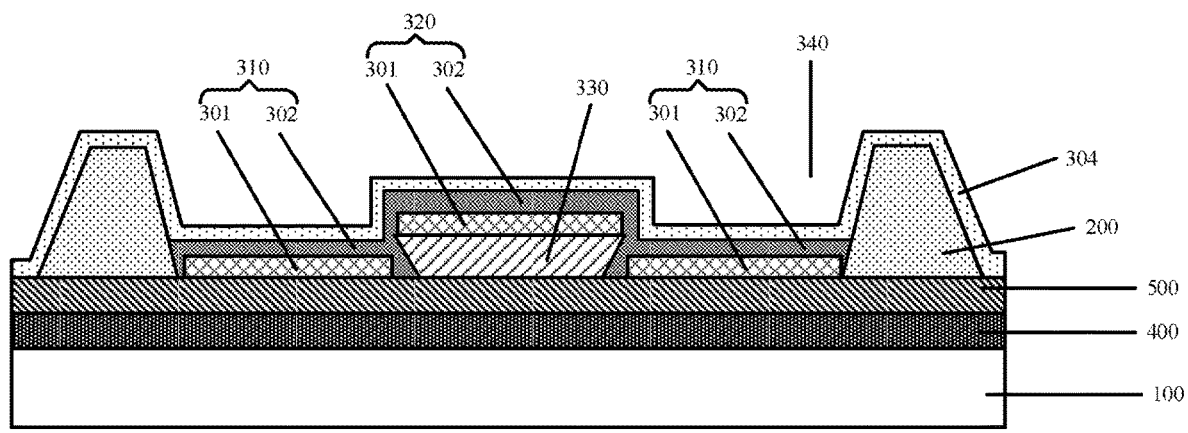
FIG. 10 is a schematic cross-sectional view of an array substrate structure according to another embodiment of the present disclosure.
Figure 11:
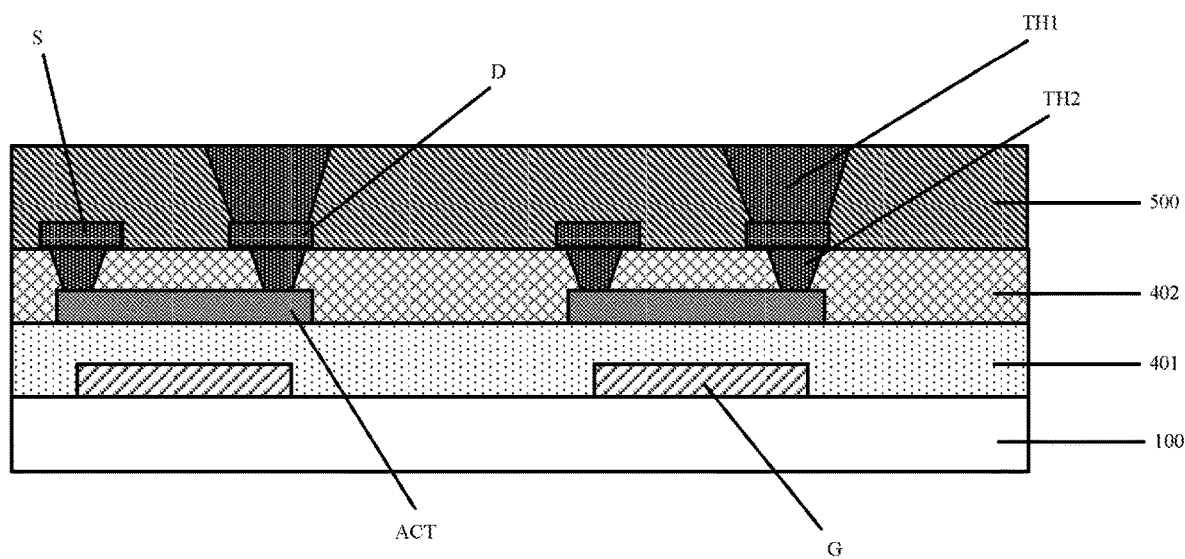
FIG. 11 is a schematic cross-sectional view of a pixel-driving film layer according to an embodiment of the present disclosure.

Other layers of films in the array substrate are hereinafter described. Reference is made to FIGS. 10 and 11. FIG. 10 is a schematic cross-sectional view of an array substrate structure, and FIG. 11 is a schematic cross-sectional view of a pixel-driving film layer. The array substrate further includes a pixel-driving film layer 400 and a planarization layer 500 that are located between the first substrate 100 and the pixel-defining layer 200.

The planarization layer 500 is located between the pixel-driving film layer 400 and the pixel-defining layer 200. The planarization layer 500 includes multiple first through-holes TH1 running through the planarization layer 500. The anode 301 is electrically connected to the pixel-driving film layer 400 via the first through-hole TH1.

The pixel-driving film layer 400 includes multiple gate electrodes G, a gate-insulating layer 401, multiple active layers ACT, a passivation layer 402, multiple source electrodes S and multiple drain electrodes D.

The multiple gate electrodes G are arranged in an array and located on the first substrate.

The gate insulating layer 401 covers the multiple gates G.

The multiple active layers ACT are arranged in an array and located at a side of the gate insulating layer 401 facing away from the first substrate 100. The active layer ACT includes a trench region, and a source region and a drain region that are respectively located at two sides of the trench region.

The passivation layer 402 covers the multiple active layers. The passivation layer 402 includes multiple second through-holes TH2. The source region and the drain region are at least partially exposed by the second through-hole TH2.

The multiple source electrodes S and multiple drain electrodes D are located on the passivation layer 402. The source electrode S is connected to the source region via the second through-hole TH2. The drain electrode D is connected to the drain region via the second through-hole TH2.

The anode 301 is electrically connected to the drain electrode S via the first through-hole TH1.

The pixel-driving film layer formed by a thin film transistor (TFT) of a bottom-gate type is taken as an example for illustration in FIG. 10. In some embodiments of the present disclosure, the thin film transistor in the pixel-driving film layer may be of a top-gate type, which is not limited in the present disclosure.

Reference is further made to FIGS. 10 and 11, the anode 301 of the first sub-pixel 310 and the anode 301 of the second sub-pixel 320 are not in a same plane due to the existence of the isolation mesa 330, and are separated from each other. The anode 301 of the first sub-pixel 310 and the anode 301 of the second sub-pixel 320 are electrically insulated from each other. Thereby, the objective of isolating the anode 301 of the second sub-pixel 320 and the anode 301 of the first sub-pixel 310 is achieved. The light-emitting layer 302 of the first sub-pixel 310 and the light-emitting layer 302 of the second sub-pixel 320 are not in a same plane due to existence of the isolation mesa 330. The light-emitting layer 302 of the first sub-pixel 310 and the light emitting layer 302 of the second sub-pixel 320 are continuously filled in the gap between the anode 301 of the first sub-pixel 310 and the anode 301 of the second sub-pixel 320. It is prevented that an adjacent sub-pixel is influenced via the light-emitting layer 302 in a case that the anode 301 of the second sub-pixel 320 and the anode 301 of the first sub-pixel 310 receive different voltages. The display effect of the sub-pixels is improved. The cathode is continuously arranged on the light-emitting layer 302 and the isolation mesa 330.

The method for fabricating the array substrate according to an embodiment of the present disclosure is hereinafter described. The method for fabricating the array substrate described hereinafter may correspond and be referred to the aforementioned array substrate.

Figure 12:
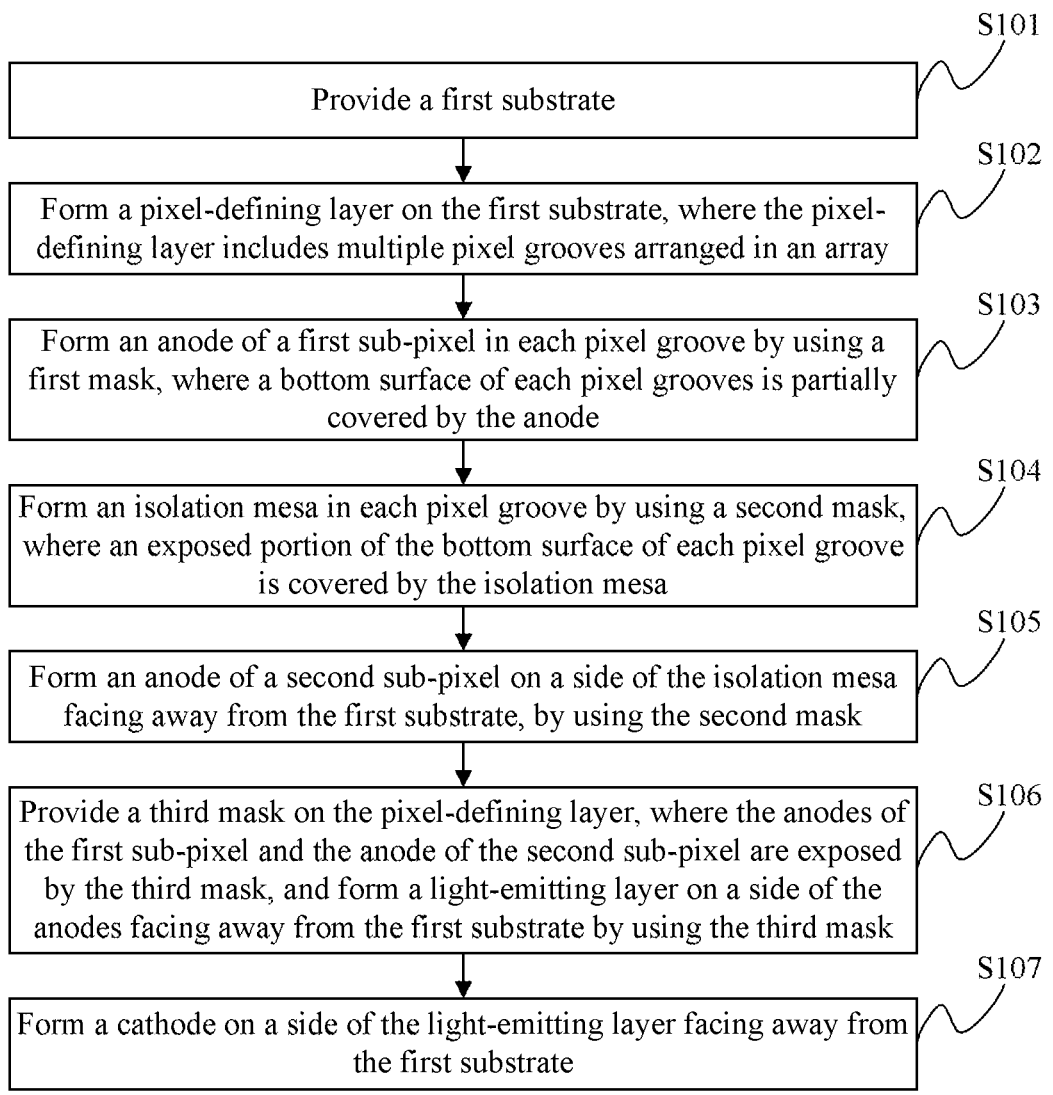
FIG. 12 is a flowchart of a method for fabricating an array substrate according to an embodiment of the present disclosure.

Shown in FIG. 12 is a schematic flowchart of a method for fabricating an array substrate. The method for fabricating an array substrate includes steps from S101 to S107.

In step S101, a first substrate is provided.

Figure 13:
FIGS. 13 to 16 show cross sectional views of each process step in fabricating an array substrate according to an embodiment of the present disclosure.

In step S102, a pixel-defining layer is formed on the first substrate. The pixel-defining layer includes multiple pixel grooves arranged in an array. Schematic structural diagrams of the first substrate and a surface of the first substrate after the step S102 are shown in FIG. 13. In FIG. 13, reference numeral 100 denotes the first substrate, and reference numeral 200 denotes the pixel-defining layer.

Figure 14:
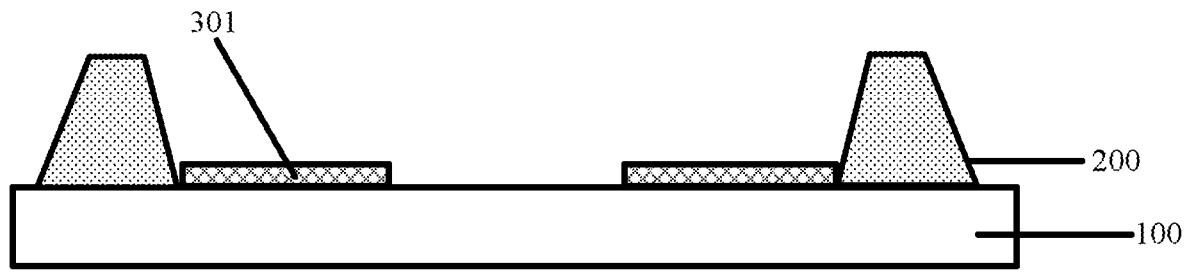

In step S103, an anode of a first sub-pixel is formed in each of the multiple pixel grooves by using a first mask. A bottom surface of each of the multiple pixel grooves is partially covered by the anode. Schematic structural diagrams of the first substrate and the surface of the first substrate after the step S103 are shown in FIG. 14. In FIG. 14, reference numeral 301 denotes the anode.

Figure 15:
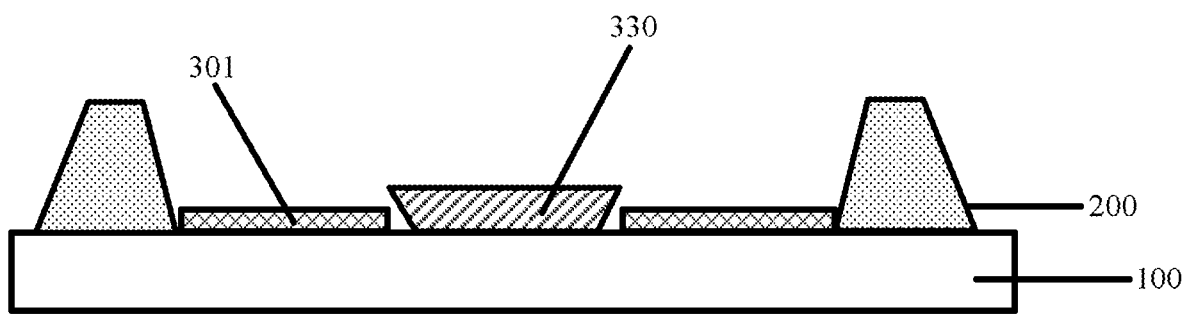

In step S104, an isolation mesa is formed in each of the multiple pixel grooves by using a second mask. An exposed portion of the bottom surface of each of the multiple pixel grooves is covered by the isolation mesa. Schematic structural diagrams of the first substrate and the surface of the first substrate after the step S104 are shown in FIG. 15. In FIG. 15, reference numeral 330 denotes the isolation mesa.

Figure 16:
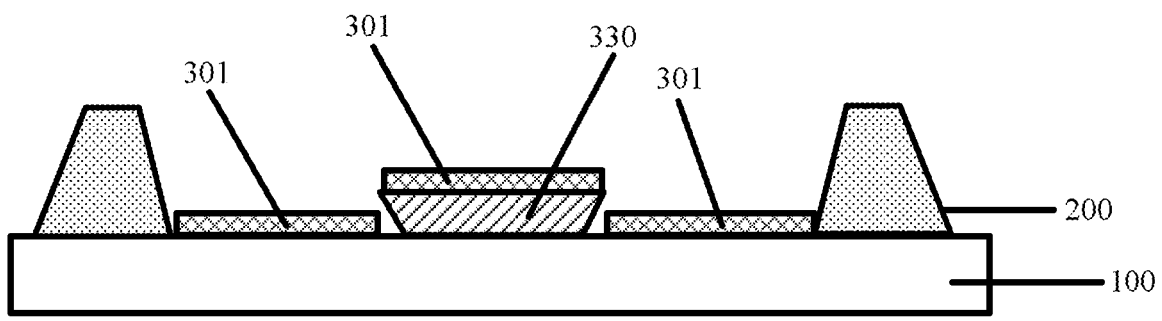

In step S105, an anode of a second sub-pixel is formed on a side of the isolation mesa facing away from the first substrate by using the second mask. Schematic structural diagrams of the first substrate and the surface of the first substrate after the step S105 are shown in FIG. 16.

In step S106, a third mask is provided on the pixel-defining layer. The anode of the first sub-pixel and the anode of the second sub-pixel are exposed by the third mask. A light-emitting layer is formed on a side of the anodes facing away from the first substrate by using the third mask. Schematic structural diagrams of the first substrate and the surface of the first substrate after the step S106 are shown in FIG. 4.

It should be noted that an orthographic projection of the anode 301 located on the isolation mesa 330 (that is, the anode 301 of the second sub-pixel 320) on the first substrate 100 and an orthographic projection of the anode 301 located on the surface of the pixel groove (that is, the anode 301 of the first sub-pixel 310) on the first substrate 100 does not overlap. Thereby, it is avoided that a large coupling capacitance is formed between the anodes of the two sub-pixels, and it is also avoided that light emitted from the light-emitting layer 302 of the first sub-pixel 310 is blocked by the anode 301 located on the isolation mesa 330.

In order to maximize the aperture ratio of the array substrate, the orthographic projection of the anode 301 of the second sub-pixel 320 on the first substrate 100 may abut against the orthographic projection of the anode 301 of the first sub-pixel 310 on the first substrate 100, to avoid a non-emitting region inside the pixel groove. It is understood that the orthographic projection of the anode 301 of the second sub-pixel 320 on the first substrate 100 and the orthographic projection of the anode 301 of the first sub-pixel 310 on the first substrate 100 may be separated by a certain distance, thereby a requirement on fabrication precision is lowered for forming the anode 301 of the second sub-pixel 320 and the anode 301 of the first sub-pixel 310.

In step S107, a cathode is formed on a side of the light-emitting layer facing away from the first substrate, to form multiple first sub-pixels and form multiple second sub-pixels that are on the surface of the isolation mesa.

Compared with conventional fabrication process of an array substrate, only two additional mask processes are applied in the method for fabricating the array substrate according to the embodiment of the present disclosure, in order to fabricate the isolation mesa and the anode of the sub-pixel. The isolation mesas and the second sub-pixels on the isolation mesas are provided to achieve the objective of isolating the light-emitting layer of the second sub-pixel and the light-emitting layer of the first sub-pixel. Thereby, it is prevented that an adjacent sub-pixel is influenced via the light-emitting layer, in a case that the anode of the second sub-pixel and the anode of the first sub-pixel receive different voltages. A display effect of the sub-pixels is improved.

Additionally, the isolation mesa arranged in the pixel groove is covered by the light-emitting layer of the second sub-pixel, and does not form a non-emitting region in the pixel groove. An aperture ratio of the array substrate is not reduced. On the basis of avoiding an influence of crosstalk between the adjacent sub-pixels, the non-emitting region is not introduced into the pixel groove, and high PPI of the array substrate is ensured.

Figure 17:
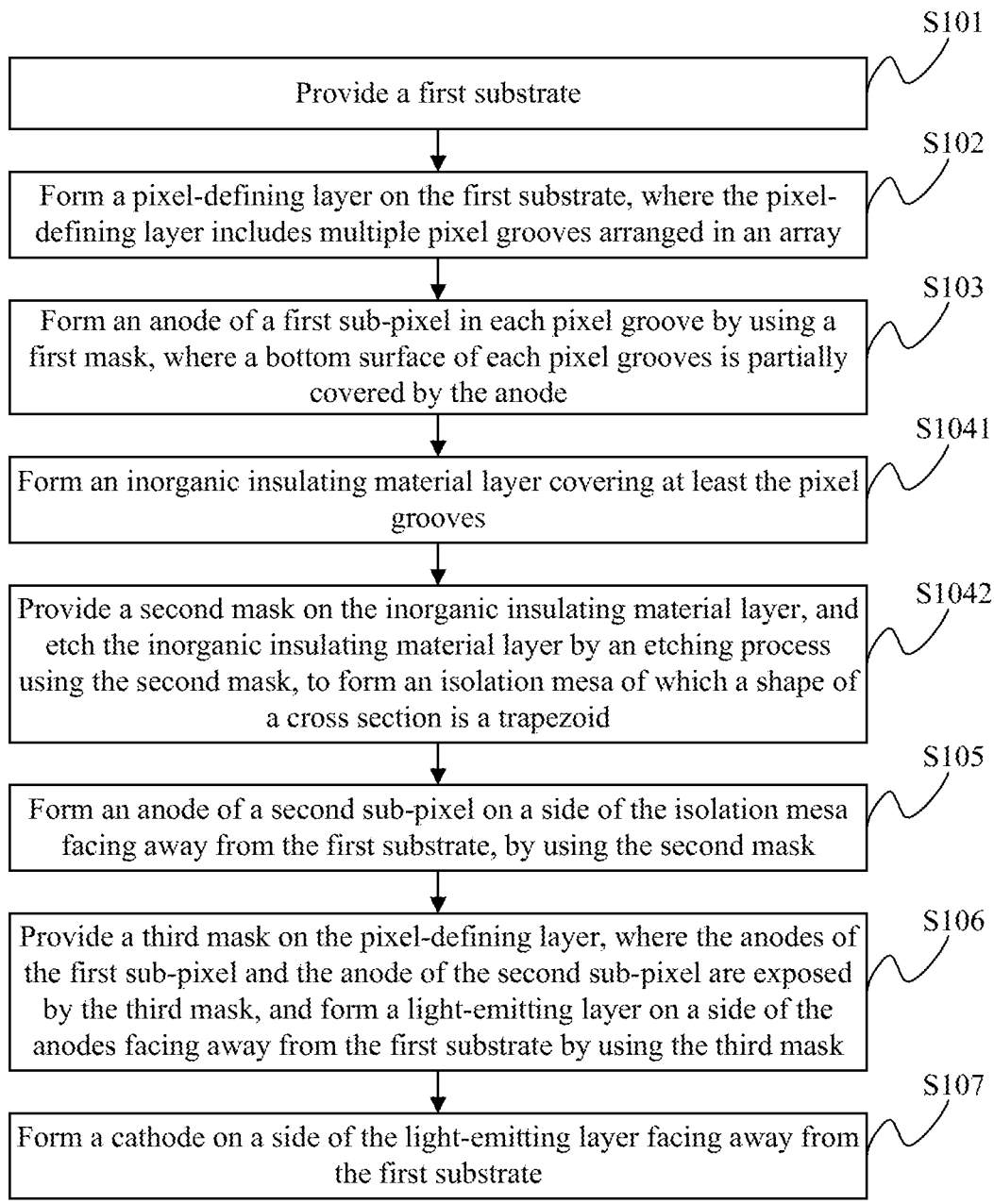
FIG. 17 is a flowchart of a method for fabricating an array substrate according to another embodiment of the present disclosure.

Based on the above embodiment, the isolation mesa is a mesa made of inorganic insulating material according to an embodiment of the present disclosure. Reference is made to FIG. 17, which is a schematic flowchart of a method for fabricating an array substrate. That the isolation mesa is formed in each of the multiple pixel grooves by using the second mask includes steps S1041 and S1042.

In step S1041, an inorganic insulating material layer covering at least the pixel grooves is formed.

In step S1042, the second mask is provided on the inorganic insulating material layer, and the inorganic insulating material layer is etched in an etching process by using the second mask, to form the isolation mesa of which a shape of a cross section is a trapezoid. The trapezoid has a first side and a second side that are parallel. The second side is located at a side of the first side away from the substrate, and a length of the second side is greater than a length of the first side.

The cross-section of the isolation mesa formed in the step S1042 is referred to FIG. 4. A shape of the cross section of the isolation mesa is an inverted trapezoid. In such case, the anode of the first sub-pixel and the anode of the second sub-pixel can be simultaneously formed by evaporating once in fabrication, without providing a mask. The reason is that the length of the second side of the inverted trapezoid is longer, and an evaporated material cannot extend from the bottom surface of the pixel groove, along a sidewall of the inverted trapezoid, to the surface of the pixel groove. Thereby, the isolation mesa of the inverted trapezoidal structure is naturally capable to isolate the anodes formed by evaporation.

A shape of the isolation mesa of which the cross section is an inverted trapezoid may be formed by controlling parameters of the etching process in the step S1042.

Figure 18:
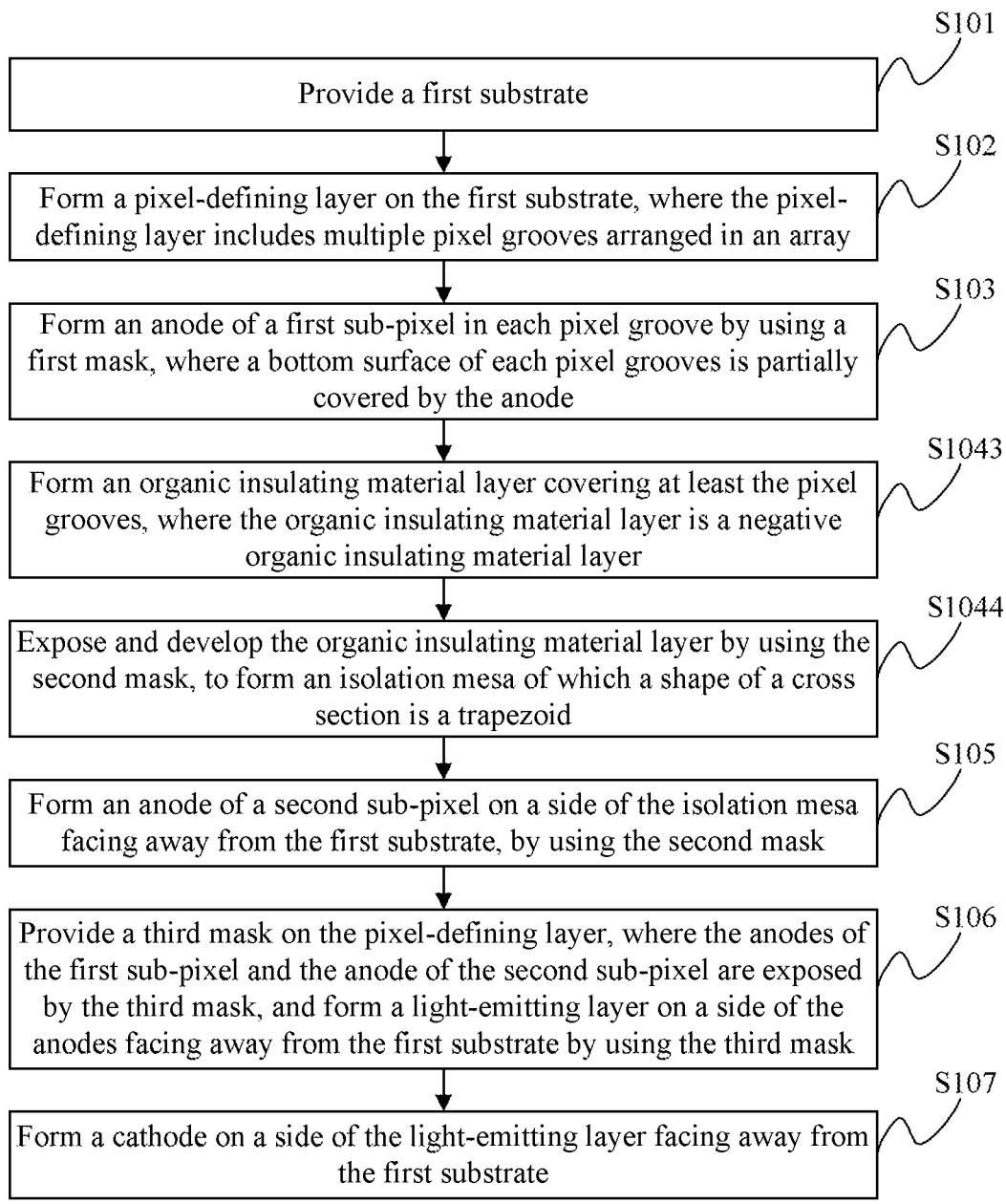
FIG. 18 is a flowchart of a method for fabricating an array substrate according to yet another embodiment of the present disclosure.

The isolation mesa may be a mesa made of an organic insulating material. In such case, reference is made to FIG. 18, which is a schematic flowchart of a method for fabricating an array substrate. That the isolation mesa is formed in each of the multiple pixel grooves by using the second mask includes steps S1043 and S1044.

In step S1043, an organic insulating material layer covering at least the pixel grooves is formed. The organic insulating material layer is a negative photoresist organic insulating material layer.

In step S1044, the organic insulating material layer is exposed and developed by using the second mask, to form the isolation mesa of which a shape of a cross section is a trapezoid. The trapezoid has a first side and a second side that are parallel. The second side is located at a side of the first side away from the substrate, and a length of the second side is greater than a length of the first side.

The cross-section of the isolation mesa formed in the step S1044 is referred to FIG. 4. In a case that the isolation mesa is the mesa made of the inorganic insulating material which is the negative photoresist organic material, the isolation mesa of which a shape of the cross section is an inverted trapezoid may be formed by controlling parameters of the exposure and development process.

Figure 19:
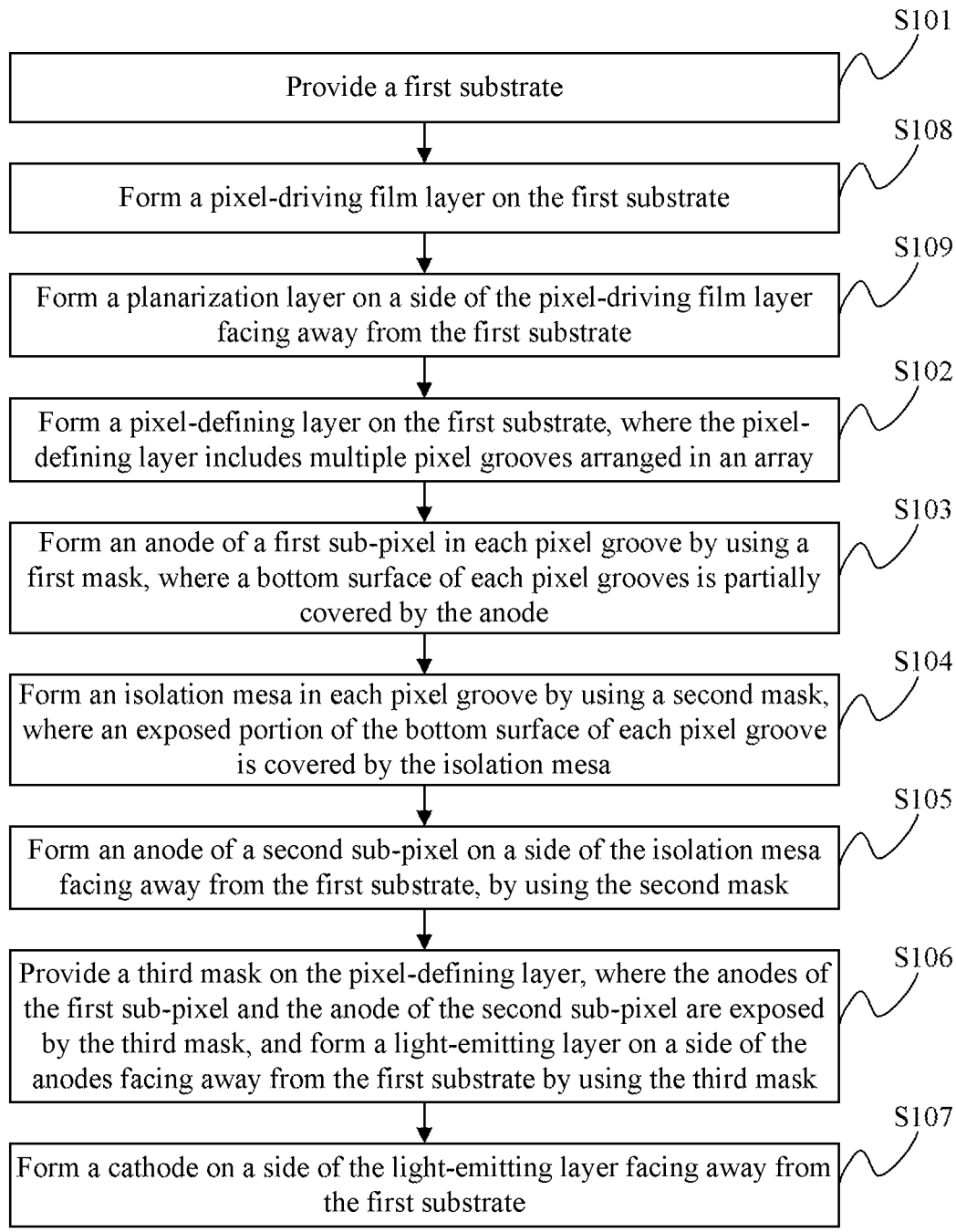
FIG. 19 is a flowchart of a method for fabricating an array substrate according to yet another embodiment of the present disclosure.
Figure 20:
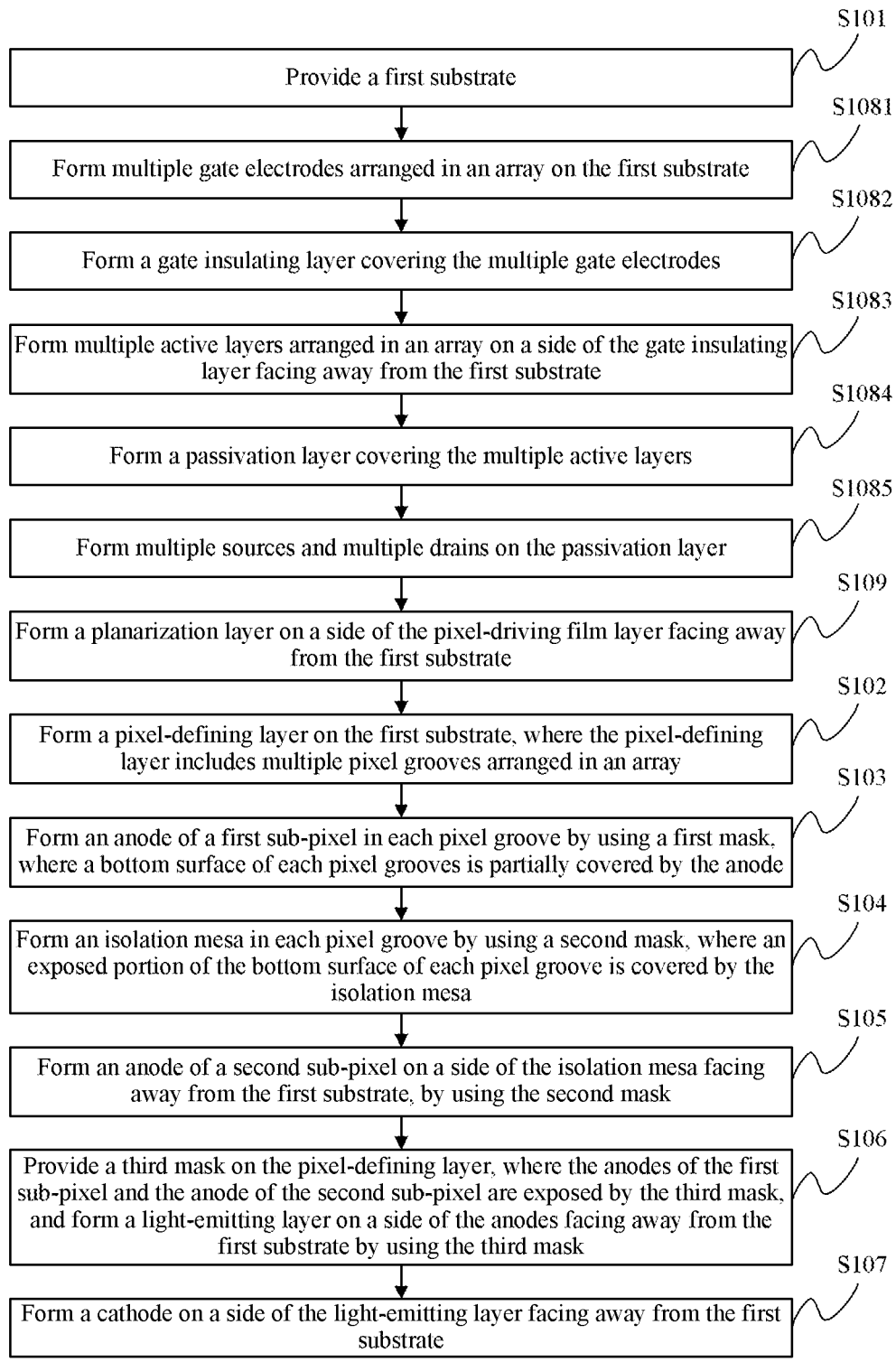
FIG. 20 is a flowchart of a method for fabricating an array substrate according to an optional embodiment of the present disclosure.

A specific process for fabricating the array substrate is hereinafter described. Reference is made to FIGS. 19 and 20. FIGS. 19 and 20 are schematic flowcharts of a method for fabricating an array substrate. Referring to FIG. 19, the method further includes steps S108 and S109 before the pixel-defining layer is formed on the first substrate.

In step S108, a pixel-driving film layer is formed on the first substrate.

In step S109, a planarization layer is formed on a side of the pixel-driving film layer facing away from the first substrate. The planarization layer includes multiple first through-holes running through the planarization layer. The anode is electrically connected to the pixel-driving film layer via the first through-hole.

Specifically, referring to FIG. 20, that the pixel-driving film layer is formed on the first substrate includes steps S1081 to S1085.

In step S1081, multiple gate electrodes arranged in an array are formed on the first substrate.

In step S1082, a gate insulating layer covering the multiple gate electrodes is formed.

In step S1083, multiple active layers arranged in an array are formed on a side of the gate insulating layer facing away from the first substrate. The active layer includes a trench region, and a source region and a drain region that are respectively located at two sides of the trench region.

In step S1084, a passivation layer covering the multiple active layers is formed. The passivation layer includes multiple second through-holes. The source region and the drain region are at least partially exposed by the second through-holes.

In step S1085, multiple source electrodes and multiple drain electrodes are formed on the passivation layer. The source electrode is connected to the source region via the second through-holes. The drain electrode is connected to the drain region via the second through-holes.

In FIG. 20, a thin film transistor of a bottom-gate type is taken as an example for illustration. According to other embodiments of the present disclosure, the thin film transistor in the pixel-driving film layer may be of a top-gate type, which is determined by a specific situation and not limited by the present disclosure.

Figure 21:
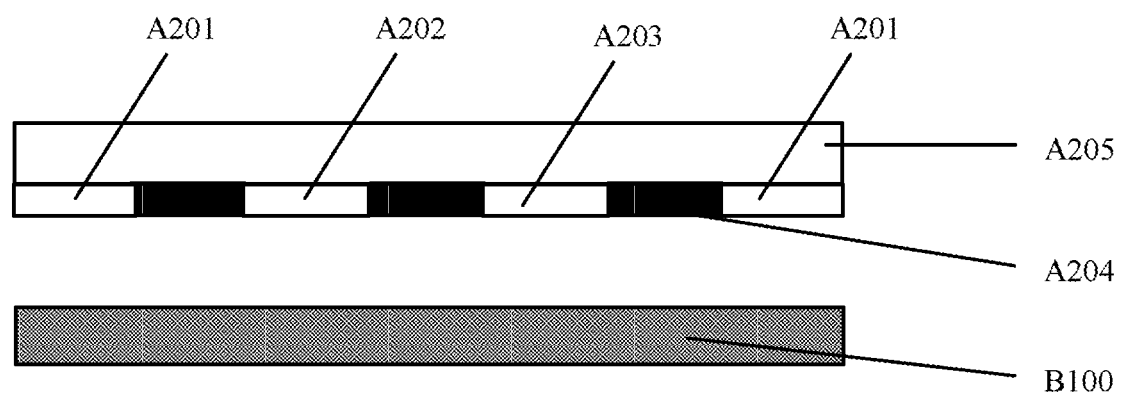
FIG. 21 is a schematic cross-sectional view of a display panel structure according to an embodiment of the present disclosure.

Correspondingly, a display panel is further provided according to an embodiment of the present disclosure, as shown in FIG. 21. FIG. 21 is a schematic cross-sectional view of a display panel. The display panel includes a color film substrate and an array substrate B100 that are arranged opposite to each other. The array substrate B100 is the array substrate according to any of the above embodiments.

The color filter substrate includes a color film base A205, and a black matrix A204 and a color photoresist that are provided on the color film base. The color photoresist includes a first color photoresist A201, a second color photoresist A202 and a third color photoresist A203. Lights emitted via the three types of photoresists are lights of different colors, for example, red, green and blue, respectively.

In summary, the array substrate, the method for fabricating the array substrate and the display panel are provided according to the present disclosure. The array substrate is provided with at least one isolation mesa in each of the multiple pixel grooves in the pixel-defining layer, so that the light-emitting layer of the second sub-pixel located on the isolation mesa and the light-emitting layer of the first sub-pixel located on the exposed portion of the bottom surface of the pixel groove are on different planes. Thereby, the objective of isolating the light-emitting layer of the second sub-pixel and the light-emitting layer of the first sub-pixel is achieved. It is prevented that an adjacent sub-pixel is influenced via the light-emitting layer, in a case that the anode of the second sub-pixel and the anode of the first sub-pixel receive different voltages. A display effect of the sub-pixels is improved.

Additionally, the isolation mesa arranged in the pixel groove is covered by the light-emitting layer of the second sub-pixel, and does not form a non-emitting region in the pixel groove. An aperture ratio of the array substrate is not reduced. High PPI of the array substrate is ensured in avoiding an influence of crosstalk between the adjacent sub-pixels.

The embodiments of the present disclosure are described in a progressive manner, and each embodiment places emphasis on the difference from other embodiments. Therefore, one embodiment can refer to other embodiments for the same or similar parts.

According to the description of the disclosed embodiments, those skilled in the art can implement or use the present disclosure. Various modifications made to these embodiments may be obvious to those skilled in the art, and the general principle defined herein may be implemented in other embodiments without departing from the spirit or scope of the present disclosure. Therefore, the present disclosure is not limited to the embodiments described herein but confirms to a widest scope in accordance with principles and novel features disclosed in the present disclosure.

The invention claimed is:

1. An array substrate, comprising:
    a first substrate;
    a pixel-defining layer located on the first substrate, wherein the pixel-defining layer comprises a plurality of pixel grooves arranged in a first array;
    at least one isolation mesa located in each of the plurality of pixel grooves, wherein a bottom surface of each of the plurality of pixel grooves is partially covered by the at least one isolation mesa;
    a first sub-pixel located on an uncovered portion of the bottom surface of each of the plurality of pixel grooves; and
    a second sub-pixel located at a side of the at least one isolation mesa facing away from the first substrate;
    wherein the first sub-pixel comprises a first anode, the second sub-pixel comprises a second anode, a light-emitting layer is located on the first anode and the second anode, and a cathode located at a side of the light-emitting layer facing away from the first substrate.

2. The array substrate according to claim 1, wherein:
    one of the at least one isolation mesa comprises a first surface facing the first substrate, and a second surface facing away from the first substrate; and
    an orthographic projection of the first surface on the first substrate is covered by the orthographic projection of the second surface on the first substrate.

3. The array substrate according to claim 2, wherein:
    a shape of a cross section perpendicular to the first substrate of the one of the at least one isolation mesa is a trapezoid, a first side of the trapezoid is parallel to a second side of the trapezoid, the second side is located at a side of the first side away from the substrate, and a length of the second side is greater than a length of the first side; or a shape of a cross section of the one of the at least one isolation mesa is a rectangle.

4. The array substrate according to claim 1, wherein in each of the plurality of pixel grooves, a quantity of the second sub-pixels is one, a quantity of the first sub-pixels is two, and the two first sub-pixels are respectively located on two sides of the at least one isolation mesa.

5. The array substrate according to claim 1, wherein in each of the plurality of pixel grooves, a quantity of the at least one isolation mesas is three; a quantity of the second sub-pixel is three, and a number of the first sub-pixel is three.

6. The array substrate according to claim 5, wherein:
the bottom surface of each of the plurality of pixel grooves is a regular hexagon;
a top surface of each of the three isolation mesas is an equilateral triangle; and
the three isolation mesas share a same vertex, and every two adjacent ones of the at least one isolation mesas is separated by an angle of 60°.

7. The array substrate according to claim 1, wherein the at least one isolation mesa comprises one of an organic insulating material and an inorganic insulating material.

8. The array substrate according to claim 1, further comprising a pixel-driving film layer and a planarization layer that are located between the first substrate and the pixel-defining layer, wherein:
the planarization layer is located between the pixel-driving film layer and the pixel-defining layer, the planarization layer comprises a plurality of first through holes running through the planarization layer, and the anode is electrically connected to the pixel-driving film layer via the plurality of first through holes.

9. The array substrate according to claim 8, wherein the pixel-driving film layer comprises:
a plurality of gate electrodes, arranged in a second array and located on the first substrate;
a gate insulating layer, disposed on the plurality of gate electrodes;
a plurality of active layers, arranged in a third array and located on a side of the gate insulating layer facing away from the first substrate, wherein each of the plurality of active layers comprises a trench region, a source region and a drain region, and the source region and the drain region are located on two sides of the trench region;
a passivation layer, covering the plurality of active layers, wherein the passivation layer comprises a plurality of second through-holes, and each of the source region and the drain region is at least partially exposed by the plurality of second through-holes; and
a plurality of source electrodes and a plurality of drain electrodes, located on the passivation layer, wherein the plurality of source electrodes is connected to the source regions of the plurality of active layers via the plurality of second through-holes, the plurality of drain electrodes are connected to the drain regions of the plurality of active layers via the plurality of second through-holes;
wherein the anode is electrically connected to one of the plurality of drain electrodes via one of the plurality of first through-holes.

10. A display panel, comprising a color film substrate and the array substrate according to claim 1, wherein the color film substrate and the array substrate are arranged opposite to each other.

* * * * *